United States Patent
Koga et al.

(10) Patent No.: US 11,161,415 B1
(45) Date of Patent: Nov. 2, 2021

(54) SYSTEM AND METHOD FOR ELECTRONIC POWER TAKE-OFF CONTROLS

(71) Applicant: Oshkosh Corporation, Oshkosh, WI (US)

(72) Inventors: Jeffrey Koga, Oshkosh, WI (US); Emily Davis, Rochester, MN (US); Jerrod Kappers, Oshkosh, WI (US); Vince Schad, Oshkosh, WI (US); Robert S. Messina, Oshkosh, WI (US); Christopher K. Yakes, Oshkosh, WI (US); Vincent Hoover, Byron, MN (US); Clinton T. Weckwerth, Pine Island, MN (US); Zachary L. Klein, Rochester, MN (US); John Beck, Oshkosh, WI (US); Brendan Chan, Oshkosh, WI (US); Skylar A. Wachter, Dodge Center, MN (US); Nader Nasr, Neenah, WI (US); Chad K. Smith, Omro, WI (US); Logan Gary, Oshkosh, WI (US); Derek A. Wente, Austin, MN (US); Shawn Naglik, Oshkosh, WI (US); Mike J. Bolton, Oshkosh, WI (US); Jacob Wallin, Oshkosh, WI (US); Quincy Wittman, Oshkosh, WI (US); Christopher J. Rukas, Oshkosh, WI (US); Dylan Hess, Oshkosh, WI (US); Jason Rice, Oshkosh, WI (US); Zhenyi Wei, Oshkosh, WI (US); Bashar Amin, Oshkosh, WI (US); Catherine Linsmeier, Oshkosh, WI (US); Joshua D. Rocholl, Rochester, MN (US)

(73) Assignee: Oshkosh Corporation, Oshkosh, WI (US)

(*) Notice: Subject to any disclaimer, the term of this patent is extended or adjusted under 35 U.S.C. 154(b) by 0 days.

(21) Appl. No.: 17/327,336

(22) Filed: May 21, 2021

Related U.S. Application Data

(60) Provisional application No. 63/084,415, filed on Sep. 28, 2020.

(51) Int. Cl.
*B60L 3/00* (2019.01)
*B60K 1/02* (2006.01)
(Continued)

(52) U.S. Cl.
CPC ............... *B60L 3/003* (2013.01); *B60K 1/02* (2013.01); *B60K 1/04* (2013.01); *B60K 25/02* (2013.01);
(Continued)

(58) Field of Classification Search
CPC ...... B60L 3/003; B60L 2200/40; B60L 50/66; B60L 1/003; H05K 7/20272;
(Continued)

(56) References Cited

U.S. PATENT DOCUMENTS

| 6,105,984 | A  | 8/2000 | Schmitz et al. |
| 6,516,914 | B1 | 2/2003 | Andersen et al. |

(Continued)

*Primary Examiner* — Tyler J Lee
(74) *Attorney, Agent, or Firm* — Foley & Lardner LLP

(57) ABSTRACT

A refuse vehicle includes a chassis supporting a plurality of wheels, a battery supported by the chassis and configured to provide electrical power to a first motor, and an electric power take-off system coupled to the vehicle body. The electric power-take-off system includes a second motor configured to convert electrical power received from the battery into hydraulic power, an inverter configured to provide electrical power to the second motor from the battery, a heat dissipation device coupled to the inverter, a first sensor configured to detect thermal energy within the inverter, and a controller configured to receive data from the
(Continued)

first sensor and provide operating parameters to the heat dissipation device, wherein the controller is further configured to determine if the data from the first sensor is greater than a critical operating condition and shut down the electric power take-off system in response.

20 Claims, 8 Drawing Sheets

(51) Int. Cl.
*B60K 25/02* (2006.01)
*B60L 50/00* (2019.01)
*H05K 7/20* (2006.01)
*B60L 50/60* (2019.01)
*B60L 1/00* (2006.01)
*G07C 5/08* (2006.01)
*B65F 3/14* (2006.01)
*B60K 1/04* (2019.01)
*B65F 3/02* (2006.01)
*B60K 1/00* (2006.01)

(52) U.S. Cl.
CPC .............. *B60L 1/003* (2013.01); *B60L 50/66* (2019.02); *B65F 3/14* (2013.01); *G07C 5/0825* (2013.01); *H05K 7/20272* (2013.01); *H05K 7/20927* (2013.01); *B60K 2001/003* (2013.01); *B60K 2025/026* (2013.01); *B60L 2200/40* (2013.01); *B65F 2003/0269* (2013.01); *B65F 2003/0279* (2013.01)

(58) Field of Classification Search
CPC ..... H05K 7/20927; G07C 5/0825; B65F 3/14; B65F 2003/0279; B65F 2003/0269; B60K 25/02; B60K 1/04; B60K 1/02; B60K 2025/026; B60K 2001/003
See application file for complete search history.

(56) References Cited

U.S. PATENT DOCUMENTS

| | | | |
|---|---|---|---|
| 6,757,597 B2 | 6/2004 | Yakes et al. |
| 6,882,917 B2 | 4/2005 | Pillar et al. |
| 6,885,920 B2 | 4/2005 | Yakes et al. |
| 7,164,977 B2 | 1/2007 | Yakes et al. |
| 7,277,782 B2 | 10/2007 | Yakes et al. |
| 7,302,320 B2 | 11/2007 | Nasr et al. |
| 7,357,203 B2 | 4/2008 | Morrow et al. |
| 7,379,797 B2 | 5/2008 | Nasr et al. |
| 7,392,122 B2 | 6/2008 | Pillar et al. |
| 7,439,711 B2 | 10/2008 | Bolton |
| 7,448,460 B2 | 11/2008 | Morrow et al. |
| 7,451,028 B2 | 11/2008 | Pillar et al. |
| 7,521,814 B2 | 4/2009 | Nasr |
| 17,520,354 | 4/2009 | Morrow et al. |
| 7,689,332 B2 | 3/2010 | Yakes et al. |
| 7,711,460 B2 | 5/2010 | Yakes et al. |
| 7,756,621 B2 | 7/2010 | Pillar et al. |
| 7,848,857 B2 | 12/2010 | Nasr et al. |
| 7,931,103 B2 | 4/2011 | Morrow et al. |
| 7,937,194 B2 | 5/2011 | Nasr et al. |
| 8,000,850 B2 | 8/2011 | Nasr et al. |
| 8,139,109 B2 | 3/2012 | Schmiedel et al. |
| 8,333,390 B2 | 12/2012 | Linsmeier et al. |
| 8,337,352 B2 | 12/2012 | Morrow et al. |
| 8,561,735 B2 | 10/2013 | Morrow et al. |
| 8,864,613 B2 | 10/2014 | Morrow et al. |
| 8,947,531 B2 | 2/2015 | Fischer et al. |
| 9,008,913 B1 | 4/2015 | Sears et al. |
| 9,045,014 B1 | 6/2015 | Verhoff et al. |
| 9,061,169 B2 | 6/2015 | Linsmeier |
| 9,114,804 B1 | 8/2015 | Shukla et al. |
| 9,132,736 B1 | 9/2015 | Shukla et al. |
| 9,174,686 B1 | 11/2015 | Messina et al. |
| 9,315,210 B2 | 4/2016 | Sears et al. |
| 9,376,102 B1 | 6/2016 | Shukla et al. |
| 9,420,203 B2 | 8/2016 | Broggi et al. |
| 9,428,042 B2 | 8/2016 | Morrow et al. |
| 9,452,750 B2 | 9/2016 | Shukla et al. |
| 9,493,921 B2 | 11/2016 | Amin et al. |
| 9,656,640 B1 | 5/2017 | Verhoff et al. |
| 9,707,869 B1 | 7/2017 | Messina et al. |
| 9,821,789 B2 | 11/2017 | Shukla et al. |
| 9,981,803 B2 | 5/2018 | Davis et al. |
| 10,029,556 B2 | 7/2018 | Morrow et al. |
| D843,281 S | 3/2019 | Gander et al. |
| 10,220,725 B2 * | 3/2019 | Rush ..................... B60L 15/007 |
| 10,315,643 B2 | 6/2019 | Shukla et al. |
| 10,392,000 B2 | 8/2019 | Shukla et al. |
| 10,414,067 B2 | 9/2019 | Datema et al. |
| 10,434,995 B2 | 10/2019 | Verhoff et al. |
| 10,457,134 B2 | 10/2019 | Morrow et al. |
| D869,332 S | 12/2019 | Gander et al. |
| D871,283 S | 12/2019 | Gander et al. |
| 10,544,556 B2 | 1/2020 | Amin et al. |
| D888,629 S | 6/2020 | Gander et al. |
| 10,800,605 B2 | 10/2020 | Rocholl et al. |
| 10,843,379 B2 | 11/2020 | Rocholl et al. |
| 10,843,549 B2 | 11/2020 | Morrow et al. |
| D905,713 S | 12/2020 | Linsmeier et al. |
| 10,859,167 B2 | 12/2020 | Jax et al. |
| D907,544 S | 1/2021 | Wall et al. |
| 10,901,409 B2 | 1/2021 | Datema et al. |
| D909,934 S | 2/2021 | Gander et al. |
| 10,940,610 B2 | 3/2021 | Clifton et al. |
| 10,987,829 B2 | 4/2021 | Datema et al. |
| 10,997,802 B2 | 5/2021 | Koga et al. |
| 11,001,135 B2 | 5/2021 | Yakes et al. |
| 11,001,440 B2 | 5/2021 | Rocholl et al. |
| 11,007,863 B2 | 5/2021 | Yakes et al. |
| 11,021,078 B2 | 6/2021 | Rocholl et al. |
| 11,042,745 B2 | 6/2021 | Wildgrube et al. |
| 11,042,750 B2 | 6/2021 | Wildgrube et al. |
| 11,046,329 B2 | 6/2021 | Clifton et al. |
| 11,052,899 B2 | 7/2021 | Shukla et al. |
| 11,059,436 B2 | 7/2021 | Wildgrube et al. |
| 2003/0195680 A1 | 10/2003 | Pillar |
| 2005/0113988 A1 | 5/2005 | Nasr et al. |
| 2005/0113996 A1 | 5/2005 | Pillar et al. |
| 2005/0119806 A1 | 6/2005 | Nasr et al. |
| 2006/0065451 A1 | 3/2006 | Morrow et al. |
| 2006/0066109 A1 | 3/2006 | Nasr |
| 2006/0106521 A1 | 5/2006 | Nasr et al. |
| 2007/0088469 A1 | 4/2007 | Schmiedel et al. |
| 2008/0059014 A1 | 3/2008 | Nasr et al. |
| 2008/0071438 A1 | 3/2008 | Nasr et al. |
| 2008/0150350 A1 | 6/2008 | Morrow et al. |
| 2009/0194347 A1 | 8/2009 | Morrow et al. |
| 2010/0116569 A1 | 5/2010 | Morrow et al. |
| 2010/0301668 A1 | 12/2010 | Yakes et al. |
| 2011/0312459 A1 | 12/2011 | Morrow et al. |
| 2013/0196806 A1 | 8/2013 | Morrow et al. |
| 2015/0283894 A1 | 10/2015 | Morrow et al. |
| 2016/0001765 A1 | 1/2016 | Shukla et al. |
| 2016/0257293 A1 * | 9/2016 | Takahashi ............. B60W 10/08 |
| 2016/0297417 A1 | 10/2016 | Shukla et al. |
| 2016/0338221 A1 * | 11/2016 | Rush ................. H05K 7/20936 |
| 2016/0361987 A1 | 12/2016 | Morrow et al. |
| 2017/0008507 A1 | 1/2017 | Shukla et al. |
| 2018/0072303 A1 | 3/2018 | Shukla et al. |
| 2018/0265289 A1 | 9/2018 | Davis et al. |
| 2018/0345783 A1 | 12/2018 | Morrow et al. |
| 2019/0039407 A1 | 2/2019 | Smith |
| 2019/0185077 A1 | 6/2019 | Smith et al. |
| 2019/0193934 A1 | 6/2019 | Rocholl et al. |
| 2019/0291711 A1 | 9/2019 | Shukla et al. |
| 2019/0322321 A1 | 10/2019 | Schwartz et al. |
| 2019/0344475 A1 | 11/2019 | Datema et al. |
| 2019/0351883 A1 | 11/2019 | Verhoff et al. |
| 2019/0381990 A1 | 12/2019 | Shukla et al. |
| 2020/0039341 A1 | 2/2020 | Morrow et al. |

(56) References Cited

U.S. PATENT DOCUMENTS

| | | |
|---|---|---|
| 2020/0230841 A1 | 7/2020 | Datema et al. |
| 2020/0230842 A1 | 7/2020 | Datema et al. |
| 2020/0262366 A1 | 8/2020 | Wildgrube et al. |
| 2020/0265656 A1 | 8/2020 | Koga et al. |
| 2020/0316816 A1 | 10/2020 | Messina et al. |
| 2020/0317083 A1 | 10/2020 | Messina et al. |
| 2020/0346547 A1 | 11/2020 | Rocholl et al. |
| 2020/0346556 A1 | 11/2020 | Rocholl et al. |
| 2020/0346557 A1 | 11/2020 | Rocholl et al. |
| 2020/0346657 A1 | 11/2020 | Clifton et al. |
| 2020/0346854 A1 | 11/2020 | Rocholl et al. |
| 2020/0346855 A1 | 11/2020 | Rocholl et al. |
| 2020/0346856 A1 | 11/2020 | Rocholl et al. |
| 2020/0346857 A1 | 11/2020 | Rocholl et al. |
| 2020/0346858 A1 | 11/2020 | Buege et al. |
| 2020/0346859 A1 | 11/2020 | Buege et al. |
| 2020/0346860 A1 | 11/2020 | Buege et al. |
| 2020/0346861 A1 | 11/2020 | Rocholl et al. |
| 2020/0346862 A1 | 11/2020 | Rocholl et al. |
| 2020/0347659 A1 | 11/2020 | Rocholl et al. |
| 2020/0347661 A1 | 11/2020 | Rocholl et al. |
| 2020/0347857 A1 | 11/2020 | Clifton et al. |
| 2020/0348681 A1 | 11/2020 | Clifton et al. |
| 2020/0348764 A1 | 11/2020 | Clifton et al. |
| 2020/0398670 A1 | 12/2020 | Rocholl et al. |
| 2020/0398695 A1 | 12/2020 | Rocholl et al. |
| 2020/0398697 A1 | 12/2020 | Rocholl et al. |
| 2020/0398772 A1 | 12/2020 | Wildgrube et al. |
| 2020/0399057 A1 | 12/2020 | Rocholl et al. |
| 2020/0399058 A1 | 12/2020 | Rocholl et al. |
| 2021/0031611 A1 | 2/2021 | Yakes et al. |
| 2021/0031612 A1 | 2/2021 | Yakes et al. |
| 2021/0031649 A1 | 2/2021 | Messina et al. |
| 2021/0054942 A1 | 2/2021 | Jax et al. |
| 2021/0069934 A1 | 3/2021 | Rocholl et al. |
| 2021/0088036 A1 | 3/2021 | Schubart et al. |
| 2021/0107483 A1 | 4/2021 | Shively et al. |
| 2021/0124347 A1 | 4/2021 | Datema et al. |
| 2021/0143663 A1 | 5/2021 | Bolton |
| 2021/0162630 A1 | 6/2021 | Clifton et al. |
| 2021/0188076 A1 | 6/2021 | Morrow et al. |
| 2021/0206372 A1 | 7/2021 | Shively et al. |
| 2021/0213642 A1 | 7/2021 | Datema et al. |
| 2021/0221216 A1 | 7/2021 | Yakes et al. |
| 2021/0225095 A1 | 7/2021 | Koga et al. |
| 2021/0229320 A1 | 7/2021 | Datema et al. |
| 2021/0229755 A1 | 7/2021 | Schwartz et al. |
| 2021/0229908 A1 | 7/2021 | Rocholl et al. |

* cited by examiner

SYSTEM AND METHOD FOR ELECTRONIC POWER TAKE-OFF CONTROLS

CROSS-REFERENCE TO RELATED APPLICATION

This application claims priority to U.S. Provisional Patent Application No. 63/084,415, filed Sep. 28, 2020, the content of which is hereby incorporated by reference in its entirety.

BACKGROUND

Electric refuse vehicles (i.e., battery-powered refuse vehicles) include one or more energy storage elements (e.g., batteries) that supply energy to an electric motor. The electric motor supplies rotational power to the wheels of the refuse vehicle to drive the refuse vehicle. The energy storage elements can also be used to supply energy to vehicle subsystems, like the lift system or the compactor.

SUMMARY

One exemplary embodiment relates to a refuse vehicle. The refuse vehicle includes a chassis supporting a plurality of wheels, a battery supported by the chassis and configured to provide electrical power to a first motor, wherein rotation of the first motor selectively drives at least one of the plurality of wheels, a vehicle body supported by the chassis and defining a receptacle for storing refuse therein, and an electric power take-off system coupled to the vehicle body. The electric power-take-off system includes a second motor configured to convert electrical power received from the battery into hydraulic power an inverter configured to provide electrical power to the second motor from the battery, a heat dissipation device coupled to the inverter, wherein the heat dissipation device is configured to cool the inverter, a first sensor configured to detect thermal energy within the inverter, and a controller configured to receive data from the first sensor and provide operating parameters to the heat dissipation device, wherein the controller is further configured to determine if the data from the first sensor is greater than a critical operating condition and shut down the electric power take-off system in response to determining that the data from the first sensor is greater than the critical operating condition.

Another exemplary embodiment relates to a refuse vehicle. The refuse vehicle includes a chassis supporting a plurality of wheels, a chassis battery supported by the chassis and configured to provide electrical power to a first motor, wherein rotation of the first motor selectively drives at least one of the plurality of wheels, a vehicle body supported by the chassis and defining a receptacle for storing refuse therein, and an electric power take-off system coupled to the chassis. The electric power take-off system includes a secondary battery, a second motor configured to convert electrical power received from the chassis battery into hydraulic power, an inverter configured to provide electrical power to the second motor from at least one of the chassis battery or the secondary battery, a heat dissipation device in thermal communication with the inverter. The heat dissipation device includes a fluid pump configured to pump cooling fluid through a plurality of conduits in thermal communication with the inverter, a first sensor configured to detect a fluid flow rate of cooling fluid at least one of the plurality of conduits and a second sensor configured to detect the temperature of the cooling fluid in at least one of the plurality of conduits. The refuse vehicle further includes a controller configured to receive data from the first sensor and second sensors and provide operating parameters to the heat dissipation device in response to receiving the data from the first and second sensor, wherein the controller is further configured to determine if the data from the first sensor is greater than a critical operating condition and shut down the electric power take-off system in response to determining that the data from the first sensor is greater than the critical operating condition.

Another exemplary embodiment relates to a method. The method includes providing power to one or more components a system of a refuse vehicle. The refuse vehicle includes a chassis supporting a plurality of wheels, a chassis battery supported by the chassis and configured to provide electrical power to a first motor, wherein rotation of the first motor selectively drives at least one of the plurality of wheels, a vehicle body supported by the chassis and defining a receptacle for storing refuse therein, and an electric power take-off system coupled to the vehicle body, the electric power take-off system including a second motor configured to convert electrical power received from the chassis battery into hydraulic power, an inverter configured to provide electrical power to the second motor from the chassis battery, a heat dissipation device coupled to the inverter, wherein the heat dissipation device is configured to cool the inverter, a first sensor configured to detect thermal energy within the inverter, and a controller configured to receive data from the first sensor and provide operating parameters to the heat dissipation device, providing, by the controller, initial operating parameters to the one or more components of the system, receiving, by the controller, data from the first sensor, determining, by the controller, if the data from the first sensor is greater than a critical operating condition, and shutting down the one or more components of the system, by the controller, in response to determining the data received is greater than the critical operating condition.

The invention is capable of other embodiments and of being carried out in various ways. Alternative exemplary embodiments relate to other features and combinations of features as may be recited herein.

BRIEF DESCRIPTION OF THE FIGURES

The disclosure will become more fully understood from the following detailed description, taken in conjunction with the accompanying figures, wherein like reference numerals refer to like elements, in which.

DETAILED DESCRIPTION

Figure 1:
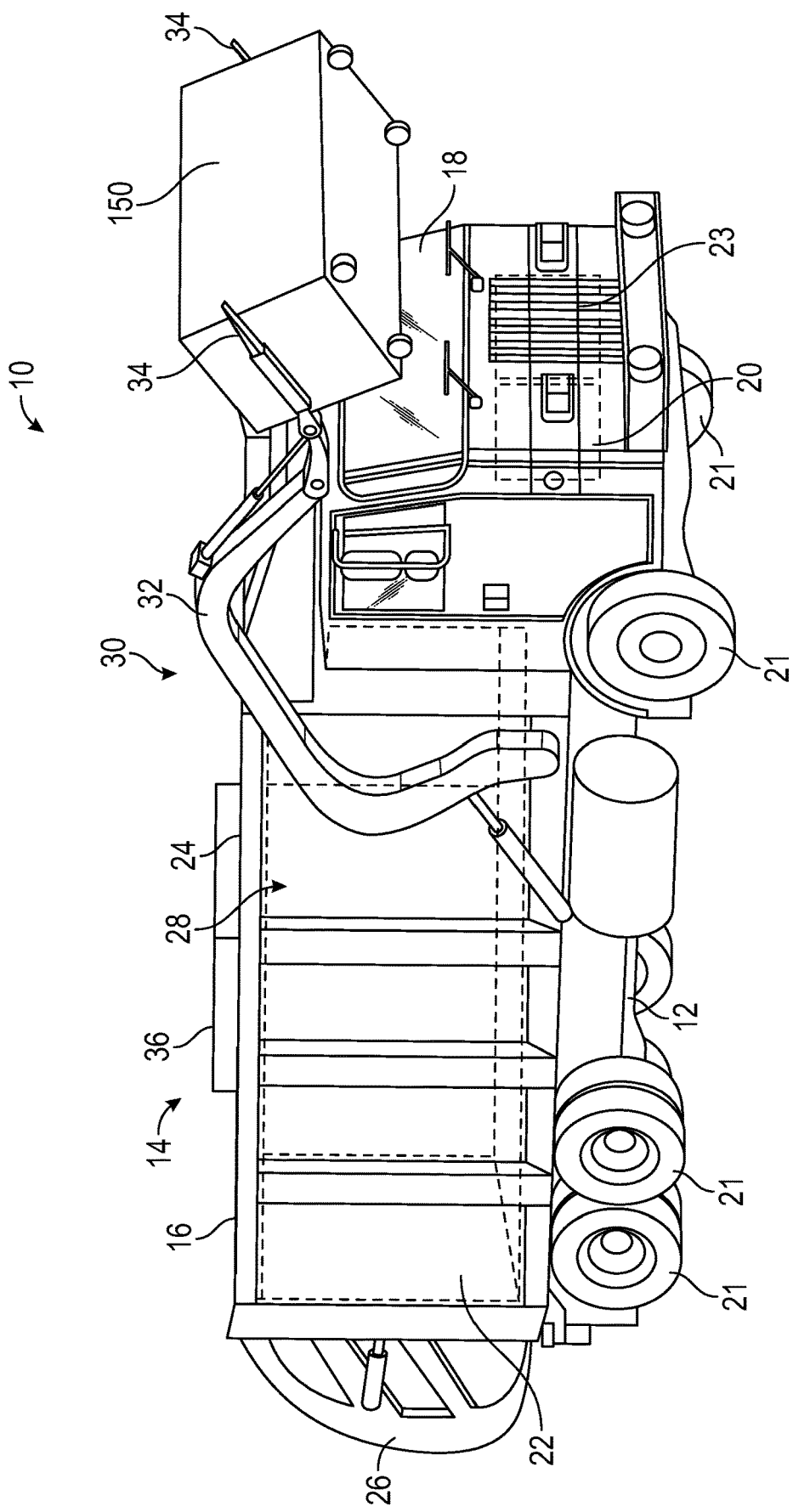
FIG. 1 is a perspective view of a front loading refuse vehicle according to an exemplary embodiment.

Before turning to the figures, which illustrate the exemplary embodiments in detail, it should be understood that the present application is not limited to the details or methodology set forth in the description or illustrated in the figures. It should also be understood that the terminology is for the purpose of description only and should not be regarded as limiting.

Referring to the FIGURES generally, the various exemplary embodiments disclosed herein relate to electric refuse vehicles. Electric refuse vehicles, or E-refuse vehicles, include an onboard energy storage device, like a battery, that provides power to a motor that produces rotational power to drive the vehicle. The energy storage device, which is commonly a battery, can be used to provide power to different subsystems on the E-refuse vehicle. The energy storage device is also configured to provide hydraulic power to different subsystems on the E-refuse vehicle through an electric power take-off (E-PTO) system. Generally, power take-off (PTO) mechanisms are included on refuse vehicles to convert energy from a power source, such as an engine, to other systems on the truck, such as a hydraulic lifting system. However, here, the E-PTO system receives electrical power from the energy storage device and provides the electrical power to an electric motor. The electric motor drives a hydraulic pump that provides pressurized hydraulic fluid to different vehicle subsystems, including the compactor and the lifting system.

The E-PTO system may include an E-PTO controller. The E-PTO controller may monitor various systems within the refuse vehicle, including the E-PTO system. The E-PTO controller may receive data from sensors within the system, compare the data to expected values under normal operating conditions, adjust the operation parameters of components of the system, and determine if a critical operating condition exists based on the sensor data. Further, the E-PTO controller may shut down the system and/or the refuse vehicle in response to detecting a critical operating condition.

Referring to FIGS. 1-4, a vehicle, shown as refuse vehicle 10, also referred to as a refuse vehicle 10 throughout the application, (e.g., garbage truck, waste collection truck, sanitation truck, etc.), includes a chassis, shown as a frame 12, and a body assembly, shown as body 14, coupled to the frame 12. The body assembly 14 defines an on-board receptacle 16 and a cab 18. The cab 18 is coupled to a front end of the frame 12, and includes various components to facilitate operation of the refuse vehicle 10 by an operator (e.g., a seat, a steering wheel, hydraulic controls, etc.) as well as components that can execute commands automatically to control different subsystems within the vehicle (e.g., computers, controllers, processing units, etc.). The refuse vehicle 10 further includes a prime mover 20 coupled to the frame 12 at a position beneath the cab 18. The prime mover 20 provides power to a plurality of motive members, shown as wheels 21, and to other systems of the vehicle (e.g., a pneumatic system, a hydraulic system, etc.). In one embodiment, the prime mover 20 is one or more electric motors coupled to the frame 12. The electric motors may consume electrical power from an on-board energy storage device (e.g., batteries 23, ultra-capacitors, etc.), from an on-board generator (e.g., an internal combustion engine), or from an external power source (e.g., overhead power lines) and provide power to the systems of the refuse vehicle 10.

Figure 2:
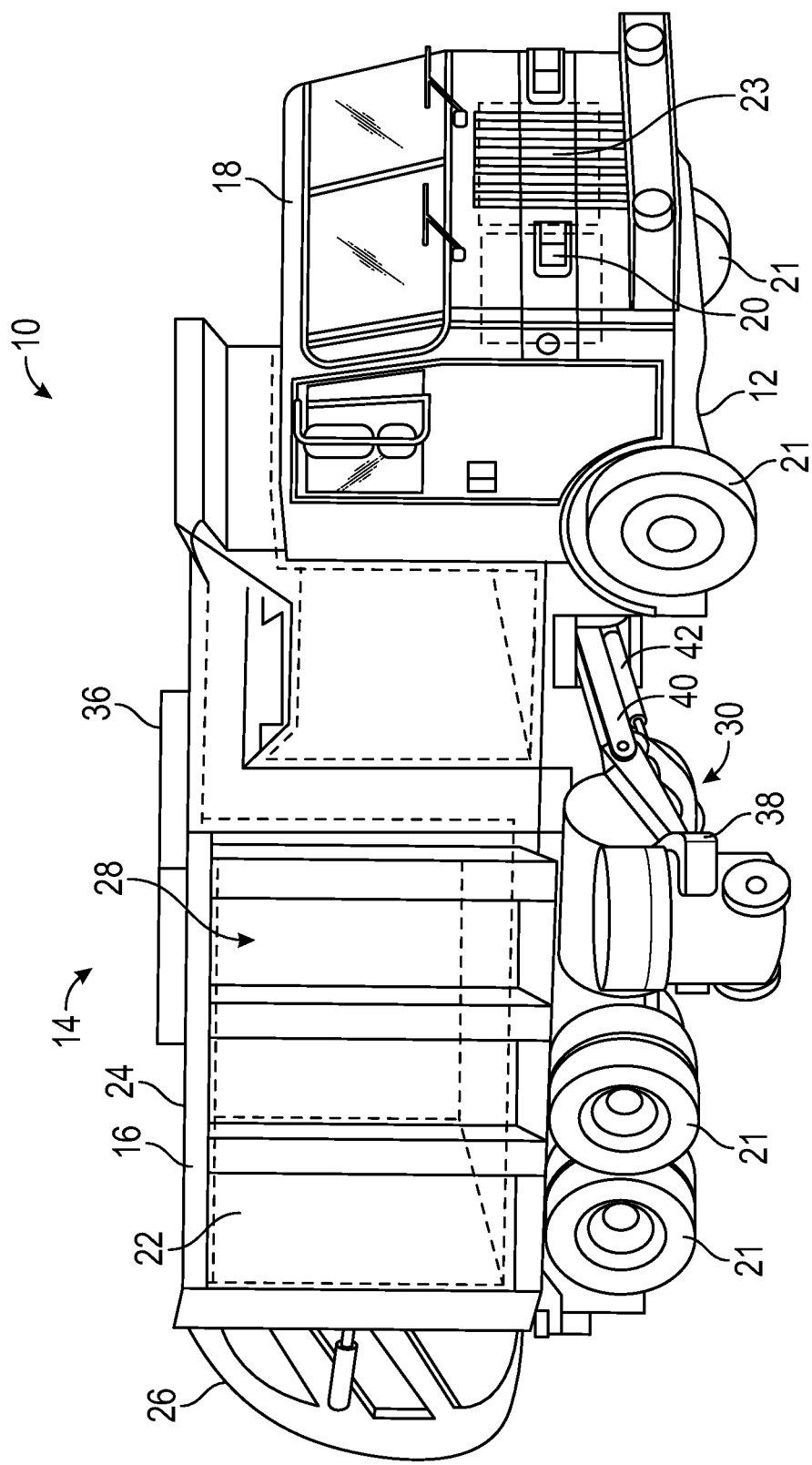
FIG. 2 is a perspective view of a side loading refuse vehicle according to an exemplary embodiment.
Figure 3:
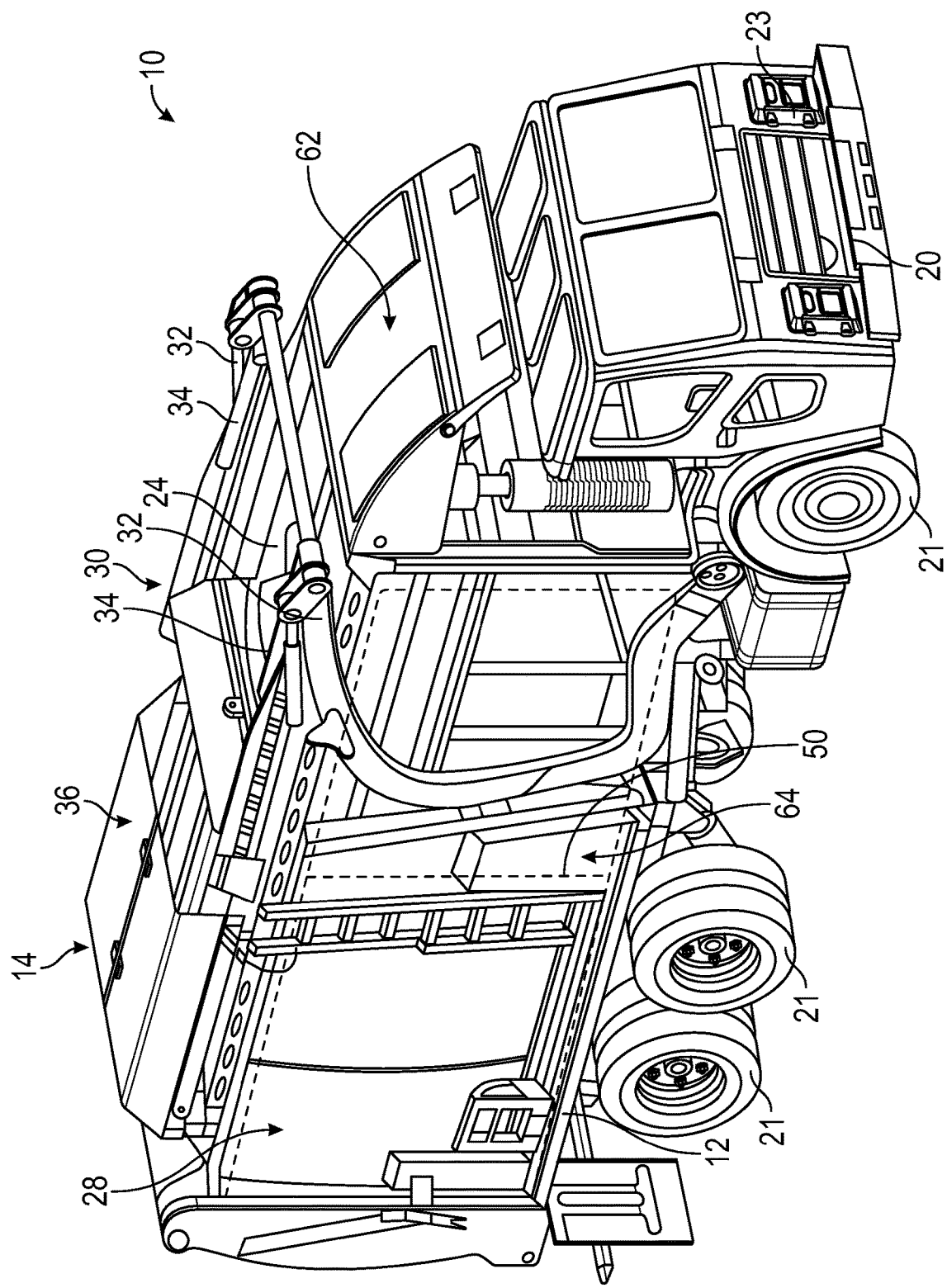
FIG. 3 is a front perspective view of an electric front loading refuse vehicle according to an exemplary embodiment.

According to an exemplary embodiment, the refuse vehicle 10 is configured to transport refuse from various waste receptacles within a municipality to a storage or processing facility (e.g., a landfill, an incineration facility, a recycling facility, etc.). As shown in FIGS. 1-3, the body 14 and on-board receptacle 16, in particular, include a series of panels, shown as panels 22, a cover 24, and a tailgate 26. The panels 22, cover 24, and tailgate 26 define a collection chamber 28 of the on-board receptacle 16. Loose refuse is placed into the collection chamber 28, where it may be thereafter compacted. The collection chamber 28 provides temporary storage for refuse during transport to a waste disposal site or a recycling facility, for example. In some embodiments, at least a portion of the on-board receptacle 16 and collection chamber 28 extend over or in front of the cab 18. According to the embodiment shown in FIGS. 1-4, the on-board receptacle 16 and collection chamber 28 are each positioned behind the cab 18. In some embodiments, the collection chamber 28 includes a hopper volume and a storage volume. Refuse is initially loaded into the hopper volume and thereafter compacted into the storage volume. According to an exemplary embodiment, the hopper volume is positioned between the storage volume and the cab 18 (i.e., refuse is loaded into a position behind the cab 18 and stored in a position further toward the rear of the refuse vehicle 10).

Referring again to the exemplary embodiment shown in FIG. 1, the refuse vehicle 10 is a front-loading refuse vehicle. As shown in FIG. 1, the refuse vehicle 10 includes a lifting system 30 that includes a pair of arms 32 coupled to the frame 12 on either side of the cab 18. The arms 32 may be rotatably coupled to the frame 12 with a pivot (e.g., a lug, a shaft, etc.). In some embodiments, actuators (e.g., hydraulic cylinders, etc.) are coupled to the frame 12 and the arms 32, and extension of the actuators rotates the arms 32 about an axis extending through the pivot. According to an exemplary embodiment, interface members, shown as forks 34, are coupled to the arms 32. The forks 34 have a generally rectangular cross-sectional shape and are configured to engage a refuse container (e.g., protrude through apertures within the refuse container, etc.). During operation of the refuse vehicle 10, the forks 34 are positioned to engage the refuse container (e.g., the refuse vehicle 10 is driven into position until the forks 34 protrude through the apertures within the refuse container). As shown in FIG. 1, the arms 32 are rotated to lift the refuse container over the cab 18. A second actuator (e.g., a hydraulic cylinder articulates the forks 34 to tip the refuse out of the container and into the hopper volume of the collection chamber 28 through an opening in the cover 24. The actuator thereafter rotates the arms 32 to return the empty refuse container to the ground. According to an exemplary embodiment, a top door 36 is slid along the cover 24 to seal the opening thereby preventing refuse from escaping the collection chamber 28 (e.g., due to wind, etc.).

Referring to the exemplary embodiment shown in FIG. 2, the refuse vehicle 10 is a side-loading refuse vehicle that includes a lifting system, shown as a grabber 38 that is configured to interface with (e.g., engage, wrap around, etc.) a refuse container (e.g., a residential garbage can, etc.). According to the exemplary embodiment shown in FIG. 2, the grabber 38 is movably coupled to the body 14 with an arm 40. The arm 40 includes a first end coupled to the body 14 and a second end coupled to the grabber 38. An actuator (e.g., a hydraulic cylinder 42) articulates the arm 40 and positions the grabber 38 to interface with the refuse container. The arm 40 may be movable within one or more directions (e.g., up and down, left and right, in and out, rotation, etc.) to facilitate positioning the grabber 38 to interface with the refuse container. According to an alternative embodiment, the grabber 38 is movably coupled to the body 14 with a track. After interfacing with the refuse container, the grabber 38 is lifted up the track (e.g., with a cable, with a hydraulic cylinder, with a rotational actuator, etc.). The track may include a curved portion at an upper portion of the body 14 so that the grabber 38 and the refuse container are tipped toward the hopper volume of the collection chamber 28. In either embodiment, the grabber 38 and the refuse container are tipped toward the hopper volume of the collection chamber 28 (e.g., with an actuator, etc.). As the grabber 38 is tipped, refuse falls through an opening in the cover 24 and into the hopper volume of the collection chamber 28. The arm 40 or the track then returns the empty refuse container to the ground, and the top door 36 may be slid along the cover 24 to seal the opening thereby preventing refuse from escaping the collection chamber 28 (e.g., due to wind).

Figure 4:
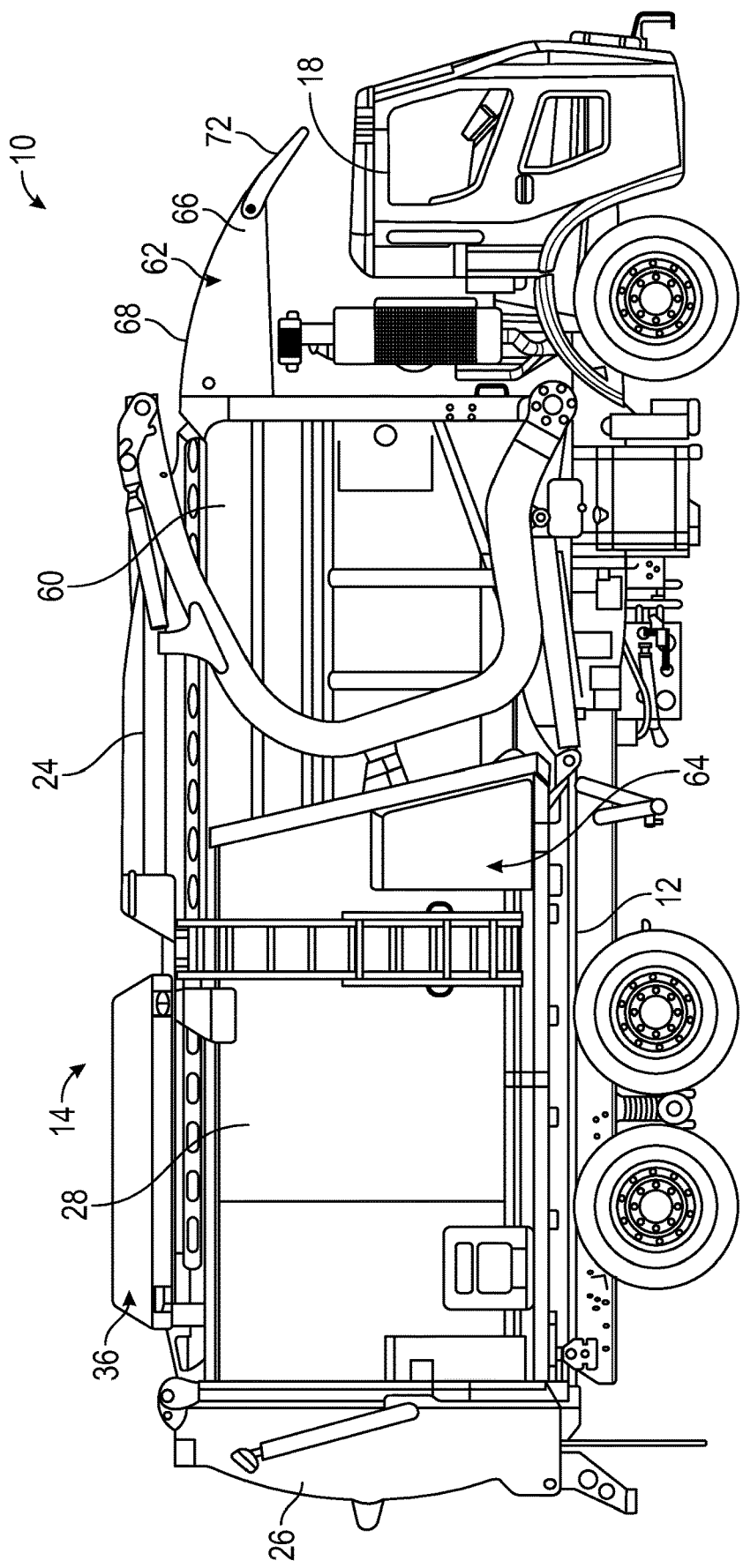
FIG. 4 is a right side view of the electric front loading refuse vehicle of FIG. 3.

Referring to FIGS. 3-4, the refuse vehicle 10 is a front loading electric refuse vehicle 10 (i.e., an E-refuse vehicle). Like the refuse vehicle 10 shown in FIG. 1, the E-refuse vehicle includes a lifting system 30 that includes a pair of arms 32 coupled to the frame 12 on either side of the cab 18. The arms 32 are rotatably coupled to the frame 12 with a pivot (e.g., a lug, a shaft, etc.). In some embodiments, actuators (e.g., hydraulic cylinders, etc.) are coupled to the frame 12 and the arms 32, and extension of the actuators rotates the arms 32 about an axis extending through the pivot. According to an exemplary embodiment, interface members, shown as forks 34, are coupled to the arms 32. The forks 34 have a generally rectangular cross-sectional shape and are configured to engage a refuse container (e.g., protrude through apertures within the refuse container, etc.). During operation of the refuse vehicle 10, the forks 34 are positioned to engage the refuse container (e.g., the refuse vehicle 10 is driven into position until the forks 34 protrude through the apertures within the refuse container). A second actuator (e.g., a hydraulic cylinder) articulates the forks 34 to tip the refuse out of the container and into the hopper volume of the collection chamber 28 through an opening in the cover 24. The actuator thereafter rotates the arms 32 to return the empty refuse container to the ground. According to an exemplary embodiment, a top door 36 is slid along the cover 24 to seal the opening thereby preventing refuse from escaping the collection chamber 28 (e.g., due to wind, etc.).

Still referring to FIGS. 3-4, the refuse vehicle 10 includes one or more energy storage devices, shown as batteries 23. The batteries 23 can be rechargeable lithium-ion batteries, for example. The batteries 23 are configured to supply electrical power to the prime mover 20, which includes one or more electric motors. The electric motors are coupled to the wheels 21 through a vehicle transmission, such that rotation of the electric motor (e.g., rotation of a drive shaft of the motor) rotates a transmission shaft, which in turn rotates the wheels 21 of the vehicle. The batteries 23 can supply additional subsystems on the refuse vehicle 10, including additional electric motors, cab controls (e.g., climate controls, steering, lights, etc.), the lifting system 30, and/or the compactor 50, for example.

Figure 5:
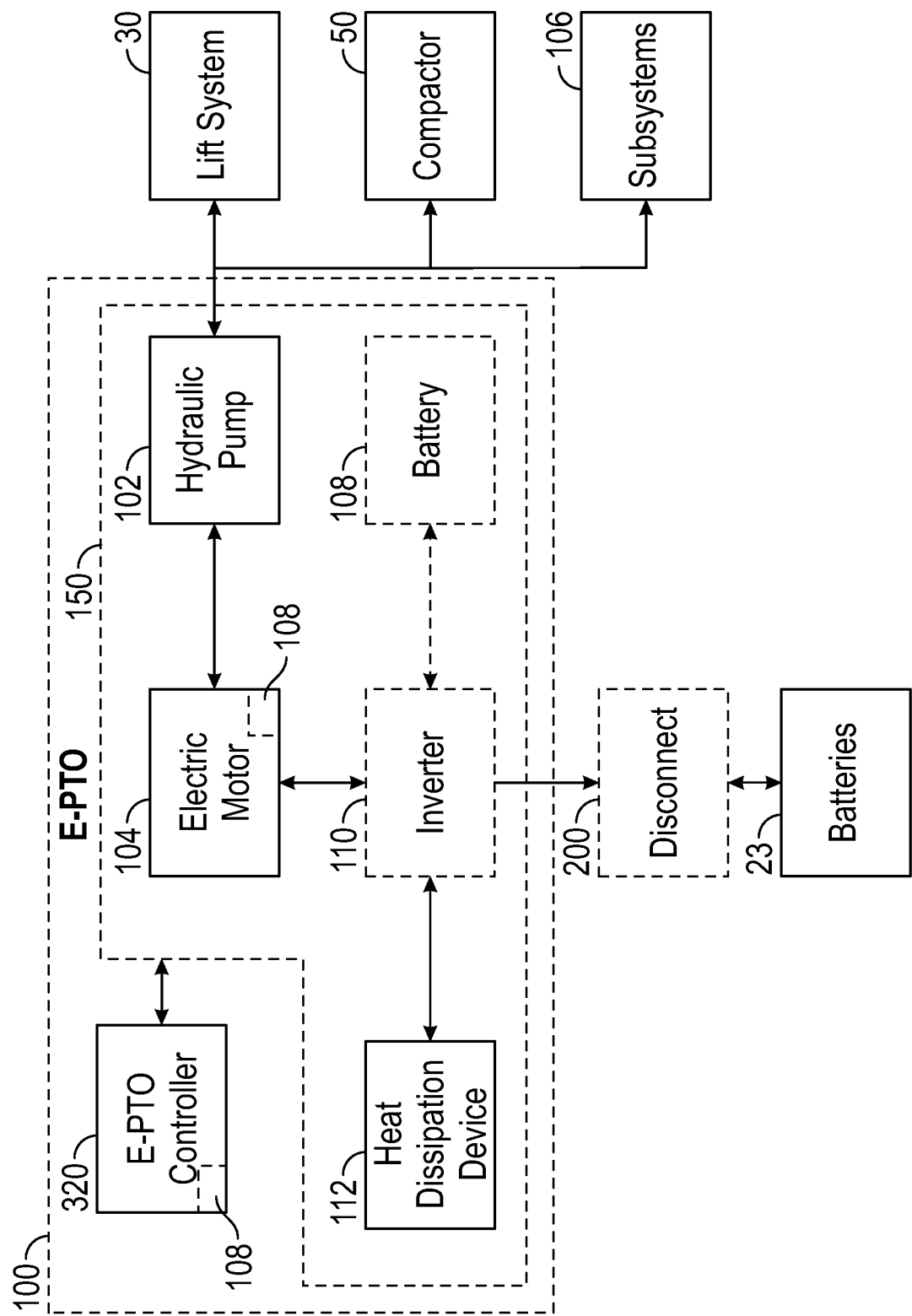
FIG. 5 is a schematic view of a control system of the refuse vehicle of FIG. 3.

The refuse vehicle 10 can be considered a hybrid refuse vehicle as it includes both electric and hydraulic power systems. As depicted in FIGS. 3-5, the refuse vehicle 10 includes an E-PTO system 100. The E-PTO system 100 is configured to receive electrical power from the batteries 23 and convert the electrical power to hydraulic power that can be used to power various other systems on the refuse vehicle 10. According to various embodiments, the E-PTO system 100 is self-contained within on the body of the refuse vehicle 10. For example, the E-PTO system 100 may be contained within a protective container (e.g., a fire resistant container) positioned on the refuse vehicle 10. The E-PTO system 100 includes an E-PTO sub-system 150 that includes various components of the E-PTO system 100, as will be discussed further herein. The E-PTO system 100 includes an E-PTO controller 320 configured to control and monitor (i.e., by receiving data from sensors) the components of the E-PTO sub-system 150 and various components of the refuse vehicle 10 as will be discussed in greater detail with reference to FIGS. 6 and 7. The E-PTO controller 320 may include a secondary battery such that the E-PTO controller 320 may operate independently of the battery 23. In some examples, the E-PTO system 100 includes an electric motor 104 driving a hydraulic pump 102. The hydraulic pump 102 pressurized hydraulic fluid onboard the refuse vehicle 10, which can then be supplied to various hydraulic cylinders and actuators present on the refuse vehicle 10. For example, the hydraulic pump 102 can provide pressurized hydraulic fluid to each of the hydraulic cylinders within the lift system 30 on the refuse vehicle. Additionally or alternatively, the hydraulic pump 102 can provide pressurized hydraulic fluid to a hydraulic cylinder controlling the compactor 50. In still further embodiments, the hydraulic pump 102 provides pressurized hydraulic fluid to the hydraulic cylinders that control a position and orientation of the tailgate 26.

With continued reference to FIG. 5, the refuse vehicle 10 may include a disconnect 200 positioned between the batteries 23 and the E-PTO system 100. The disconnect 200 provides selective electrical communication between the batteries 23 and the E-PTO system 100 that can allow the secondary vehicle systems (e.g., the lift system, compactor, etc.) to be decoupled and de-energized from the electrical power source. For example, the E-PTO controller 320 may cause the disconnect 200 to be decoupled and de-energized from the electrical power source. The disconnect 200 can create an open circuit between the batteries 23 and the E-PTO system 100, such that no electricity is supplied from the batteries 23 to the electric motor 104 or the inverter 110 that is coupled to the electric motor 104 to convert DC power from the batteries 23 to AC power for use in the electric motor 104. Without electrical power from the batteries 23, the electric motor 104 will not drive the hydraulic pump 102. Pressure within the hydraulic system will gradually decrease, such that none of the lifting system 30, compactor 50, or vehicle subsystems 106 relying upon hydraulic power will be functional. The refuse vehicle 10 can then be operated in a lower power consumption mode, given the reduced electrical load required from the batteries 23 to operate the refuse vehicle 10. The disconnect 200 further enables the refuse vehicle 10 to conserve energy when the vehicle subsystems are not needed, and can also be used to lock out the various vehicle subsystems to perform maintenance activities.

The disconnect 200 further allows an all-electric vehicle chassis to be retrofit with hydraulic power systems, which can be advantageous for a variety of reasons, as hydraulic power systems may be more responsive and durable than fully electric systems. In some examples, the E-PTO system 100 includes a dedicated secondary battery 108 that is configured to supply electrical power to the E-PTO system 100 if the disconnect 200 is tripped, such that the secondary vehicle systems can remain optional even when the E-PTO system 100 is not receiving electrical power from the batteries 23. In some examples, the E-PTO system 100 operates independently of the battery 23, and includes its own dedicated secondary battery 108 that supplies DC electrical power to the inverter 110, which converts the DC electrical power to AC electrical power that can then be supplied to the electric motor 104. In still further embodiments, the dedicated secondary battery 108 is directly coupled to the electric motor 104 and supplies DC electrical power directly to the electric motor 104. With the secondary battery 108 present within the E-PTO system 100, the E-PTO system can be agnostic to the chassis type, and can be incorporated into all-electric, hybrid, diesel, CNG, or other suitable chassis types.

In certain embodiments, a heat dissipation device 112 is coupled to the inverter 110. The heat dissipation device 112 (e.g., a radiator, fan, etc.) is configured to draw heat away from the inverter 110 to reduce the risk of overheating. In certain embodiments, the heat dissipation device 112 is coupled to the inverter 110 via conduits. The conduits may be configured to transport a cooling fluid to and from the inverter 110. For example, the heat dissipation device may include a fluid pump configured to pump cooling fluid through the conduits. In certain embodiments, sensors may be positioned within or adjacent to the conduits. For example, the sensors may be configured to determine the flow rate of the cooling fluid through the conduits and/or the temperature of the cooling fluid flowing through the conduits, as will be discussed further below. It should be appreciated that the heat dissipation device 112 may also be coupled to various other components of the refuse vehicle 10.

Figure 6:
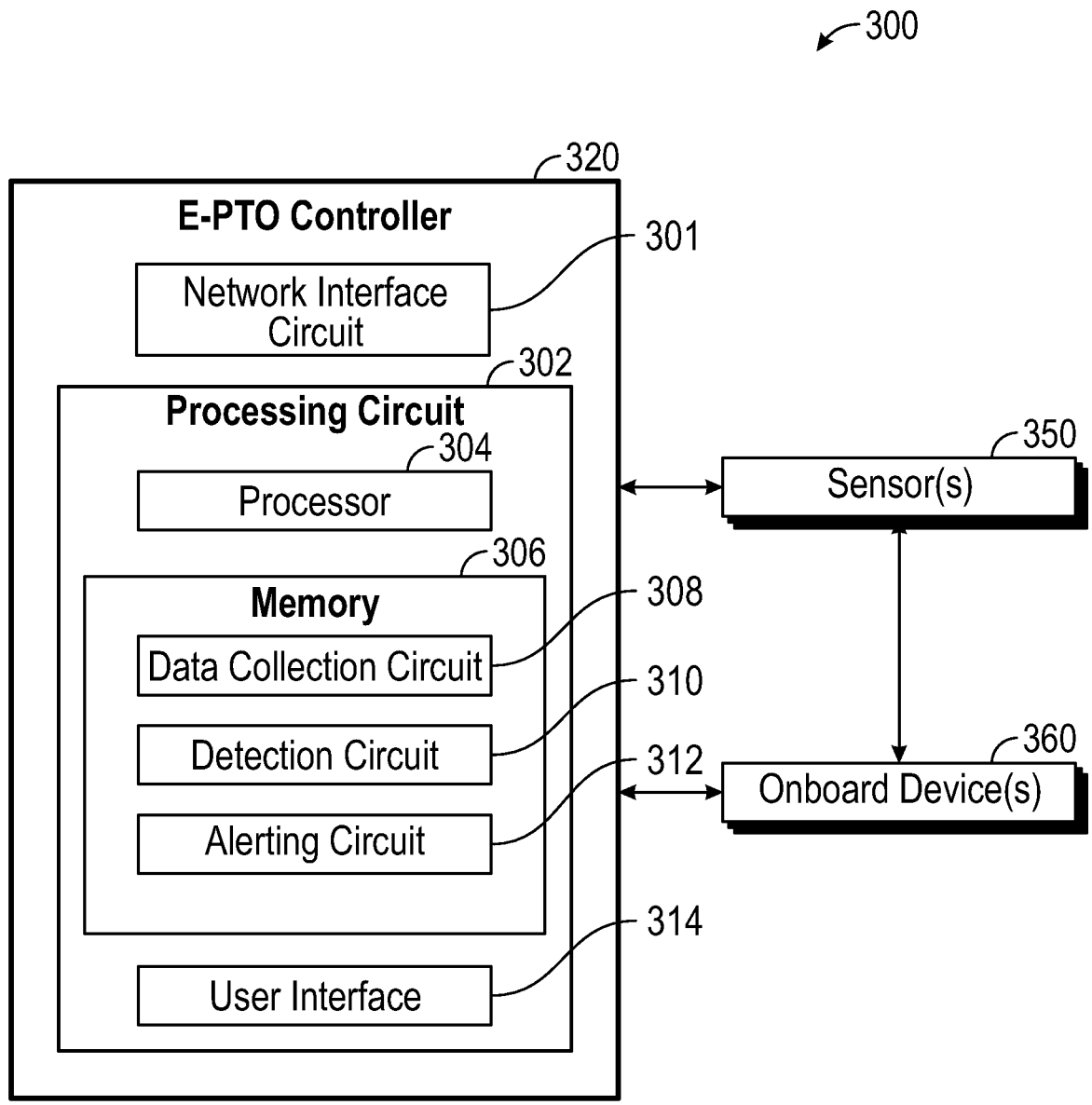
FIG. 6 is a schematic view of an E-PTO controller system according to an exemplary embodiment.

Referring now to FIG. 6, an E-PTO controller system 300 is shown according to an example embodiment. For example, the E-PTO controller system may be implemented and used by the refuse vehicle 10. The E-PTO controller system 300 includes an E-PTO controller 320 (i.e., the E-PTO controller 320 from FIG. 5). The E-PTO controller system 300 may include one or more sensor(s) 350 configured to record data associated with various onboard device(s) 360. The sensor(s) 350 may include any type of sensor that may record data corresponding to the onboard device(s) 360, including a heat sensor (e.g., a thermocouple), a thermal vision camera, a thermometer, an electric current sensor, pressure sensors, fuel level sensors, flow rate sensors, voltage detectors, noise meters, air pollution sensors, mass flow rate sensors, etc. and any combination thereof. The onboard device(s) includes any equipment that is a part of the refuse vehicle 10, including the batteries 23, the tailgate 26, the lifting system 30, the top door 36, the grabber 38, the hydraulic cylinder 42, the compactor 50, the E-PTO system 100, the hydraulic pump 102, the electric motor 104, the dedicated secondary battery 108, the inverter 110, the heat dissipation device 112, the subsystems 106, E-PTO controller 320, and all sub components thereof.

In certain embodiments, each sensor 350 is configured to record data related to one or more onboard devices 360. For example, one or more a thermal sensors 350 may detect and record the temperature of the heat dissipation device 112 and/or the inverter 110. Further, one or more sensors 350 may be within or adjacent to the conduits that connects the heat dissipation device 112 to the inverter 110. In this example, the sensors 350, may determine the temperature (e.g., thermocouples, resistance temperature detectors, thermistors, semiconductor based on integrated circuits, etc.) and/or the fluid flow rate (e.g., a Coriolis meter, a differential pressure meter, a magnetic meter, a multiphase meter, a turbine meter, an ultrasonic meter, a vortex meter, a positive displacement meter, an electromagnetic flow meter, etc.) of the cooling fluid in the conduits. In certain embodiments, more than one sensor 350 is used to record data related to a single onboard device 360. For example, a thermal sensor 350 may detect and record the temperature of the inverter 110 and an electric flow sensor 350 may be used to record the current going into and/or out of the inverter 110.

In various embodiments, the E-PTO controller 320 is communicably coupled to sensor(s) 350, such that the data recorded by the sensor(s) 350 may be saved and analyzed. The E-PTO controller 320 is also communicably coupled to the onboard device(s) 360 such that the E-PTO controller 320 may control the onboard device(s) 360 (e.g., by sending operating parameters to the onboard devices). In certain embodiments, the E-PTO controller 320 includes a network interface circuit 301 configured to enable the E-PTO controller 320 to exchange information over a network. The network interface circuit 301 can include program logic that facilitates connection of the E-PTO controller 320 to the network (e.g., a cellular network, Wi-Fi, Bluetooth, radio, etc.). The network interface circuit 301 can support communications between the E-PTO controller 320 and other systems, such as a remote monitoring computing system. For example, the network interface circuit 301 can include a cellular modem, a Bluetooth transceiver, a radio-frequency identification (RFID) transceiver, and a near-field communication (NFC) transmitter. In some embodiments, the network interface circuit 301 includes the hardware and machine-readable media sufficient to support communication over multiple channels of data communication.

The E-PTO controller 320 is shown to include a processing circuit 302 and a user interface 314. The processing circuit 302 may include a processor 304 and a memory 306. The processor 304 may be coupled to the memory 306. The processor 304 may be a general purpose or specific purpose processor, an application specific integrated circuit (ASIC), one or more field programmable gate arrays (FPGAs), a group of processing components, or other suitable processing components. The processor 304 is configured to execute computer code or instructions stored in the memory 306 or received from other computer readable media (e.g., CDROM, network storage, a remote server, etc.).

The memory 306 may include one or more devices (e.g., memory units, memory devices, storage devices, etc.) for storing data and/or computer code for completing and/or facilitating the various processes described in the present disclosure. The memory 306 may include random access memory (RAM), read-only memory (ROM), hard drive storage, temporary storage, non-volatile memory, flash memory, optical memory, or any other suitable memory for storing software objects and/or computer instructions. The memory 306 may include database components, object code components, script components, or any other type of information structure for supporting the various activities and information structures described in the present disclosure. The memory 306 may be communicably connected to the processor 304 via processing circuit 302 and may include computer code for executing (e.g., by the processor 304) one or more of the processes described herein.

The data collection circuit 308 is configured to collect and store data collected by the sensor(s) 350. For example, the data collection circuit 308 may collect data during operation of the refuse vehicle 10, and store the data. Further, the collection circuit 308 is configured to store operating parameters that the E-PTO controller 320 may provide to onboard devices 360 to control the onboard devices 360. For example, the E-PTO controller 320 may provide operating parameters to the heat dissipation device 112 such that the E-PTO controller 320 may control the cooling fluid flow rate through the conduits. The operating parameters, for example, may be used to control the fluid pump within the heat dissipation device 112. For example, the operating parameters may increase or decrease the pumping rate of the fluid pump, thereby increasing or decreasing the flow rate of cooling fluid through the conduits. The data collection circuit 308 may also store normal operating conditions corresponding to each sensor 350. For example, the normal operating conditions may include a range of values measured by each sensor 350 that indicates an onboard device 360 is operating properly. For example, if initial operating parameters are provided to an onboard device 360, the normal operating conditions may be the expected senor 350 reading taken with respect to that onboard device 360. Further, the data collection circuit 308 is configured to store threshold measurements for each sensor 350. Each sensor 350 may have a different threshold measurement. In certain embodiments, the threshold measurement may represent both an upper threshold measurement (i.e., the upper bound) and a lower threshold measurement (i.e., a lower bound), such that a sensor 350 measurement below the lower bound or above the upper bound may be indicative of a critical event. The threshold measurement may represent a maximum (i.e., upper bound) and/or minimum acceptable (i.e., lower bound) value that may be detected by a sensor 350. The threshold measurement may depended on each onboard device's 360 demands (i.e., the onboard device 360 that the sensor 350 is monitoring). For example, a sensor 350 may be used to measure the cooling fluid temperature exiting the heat dissipation device 112. A predetermined threshold measurement may be defined for the sensor 350 and if the sensor 350 measures a reading above that threshold measurement, the E-PTO controller 320 may detect a critical operation. For example, the predetermined threshold measurement for the sensor 350 may represent the maximum acceptable temperature that the cooling fluid may safely reach without risking damage to the inverter 110 or the heat dissipation device 112. In another example, a sensor 350 may be used to measure the flow rate of the cooling fluid through the inverter 110. The threshold measurement for the sensor 350 may correspond with the minimum acceptable flow rate of the cooling fluid. For example, if the flow rate dropped below the threshold measurement, the inverter 110 or heat dissipation device 112 may be damaged.

The detection circuit 310 is configured to receive signals from sensor(s) 350 and compare this data to the data stored by the data collection circuit 308. For example, the detection circuit 310 may be able to identify if various components in a system (e.g., the E-PTO system 100, the lifting system 30, the compactor 50, subsystems 106, etc.) is in compliance (i.e., operating within the normal operating condition bounds). The detection circuit 322 is also configured to determine if a sensor 350 reading exceeds the threshold measurement. For example, detection circuit 310 may determine the presence of a critical operating condition if a sensor 350 detects the temperature of the inverter 110, or a region thereof, exceeds a predetermined threshold temperature. In some embodiments, detection circuit 310 detects a location of a critical operating condition. For example, detection circuit 310 may determine a critical operating condition is occurring in the inverter 110 because a sensor 350 detecting a temperature over the threshold temperature located proximate the inverter 110. In some embodiments, if the detection circuit 310 detects a critical operating condition, the critical operating condition, and the circumstances surrounding it, is communicated to the alerting circuit 312.

Alerting circuit 312 is configured to perform one or more operations in response to receiving an indication of a critical operating condition. In some embodiments, alerting circuit 312 presents an indication of the critical operating condition to an operator of refuse vehicle 10. For example, alerting circuit 312 may control a user interface 314 to display a warning to an operator of refuse vehicle 10.

The user interface 314 is configured to present information to and receive information from a user. In some embodiments, user interface 314 includes a display device (e.g., a monitor, a touchscreen, hud, etc.). In some embodiments, user interface 314 includes an audio device (e.g., a microphone, a speaker, etc.). In various embodiments, user interface 314 receives alerts from alerting circuit 312 and presents the alerts to an operator of refuse vehicle 10. For example, user interface 314 may receive a visual alert from alerting circuit 312 and display a graphic on a display device to alert an operator of refuse vehicle 10 of a critical operating condition and the location of the critical operating condition associated with the refuse vehicle 10.

In some embodiments, alerting circuit 312 operates refuse vehicle 10. For example, alerting circuit 312 may cause the E-PTO system 100 to shut down in response to a critical operating condition being detected with respect to a component of the E-PTO system 100. For example, if the cooling fluid flow rate through the inverter 110 is sensed (i.e., by a sensor 350) to be below a threshold measurement (i.e., as determined by the detection circuit 310), the alerting circuit 312 may cause the entire E-PTO system 100 to be shut down. Further, the alerting circuit 312 may cause the entire refuse vehicle 10 to shut down in response receiving an indication of a critical operating condition. Additionally or alternatively, alerting circuit 312 may transmit one or more notifications. For example, alerting circuit 213 may transmit a notification to the network interface circuit 301, such that a notification may be sent via the network to a fleet monitoring system that monitors the status of various refuse vehicles 10.

Figure 7:
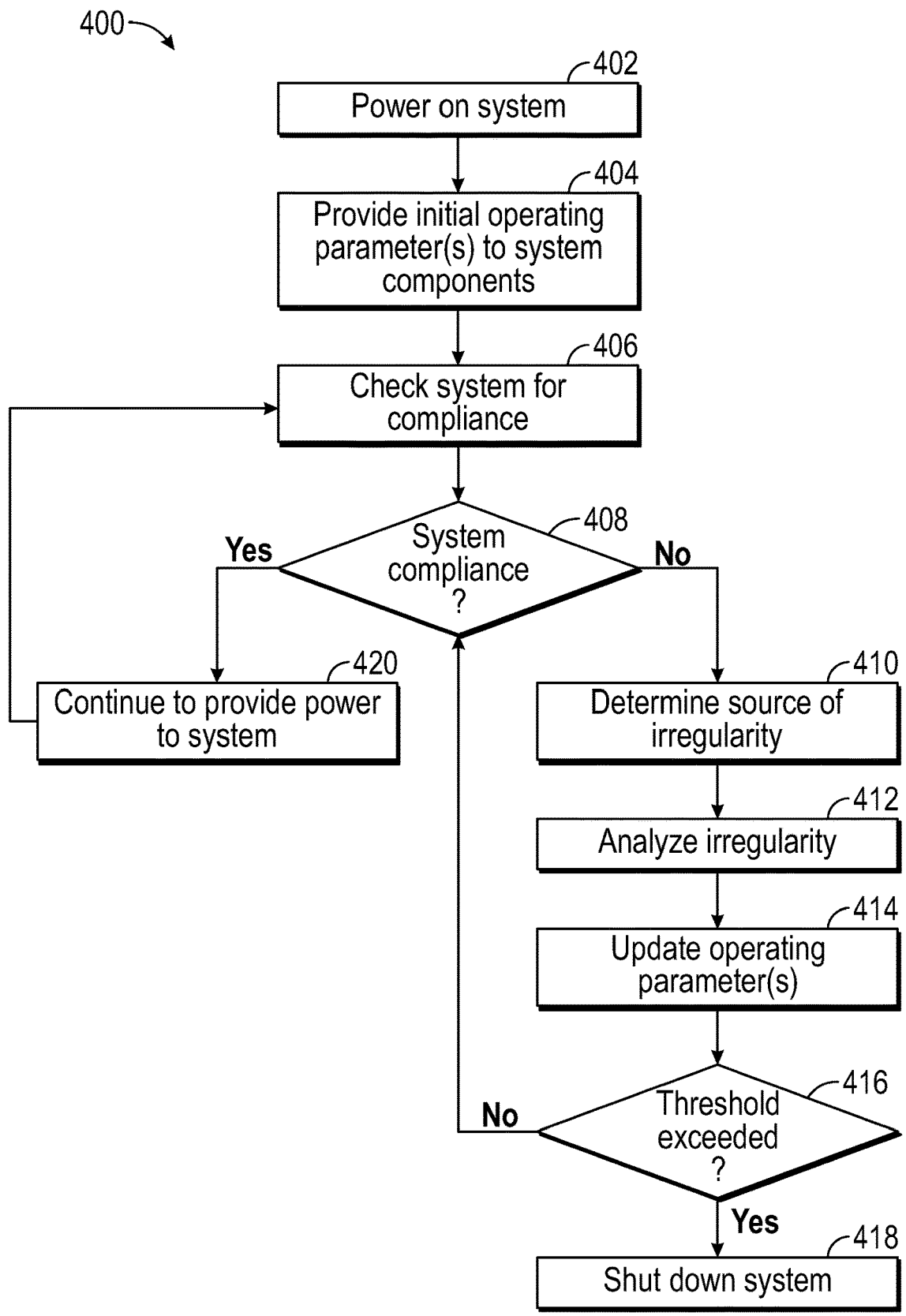
FIG. 7 is flow diagram of an E-PTO controller process according to an exemplary embodiment.

Referring now to FIG. 7, an E-PTO controls process 400 is shown according to an exemplary embodiment. For example, the process 400 may be performed by the E-PTO controller 320. The process 400 begins with process 402. Process 402 involves powering on a system. For example, the system may be the E-PTO system 100, the lift system 30, the compactor 50, any of the subsystems 106, and/or any other system included in the refuse vehicle 10. The power may be supplied to the system by the battery 23 and/or a secondary battery 108. In certain example embodiments, the E-PTO controller 320 may cause power to be supplied to the system. However, in other embodiments, another component (e.g., a start button) of the refuse vehicle 10 may cause power to be supplied to the system.

Once power is provided to the system as a part of process 402, initial operating parameters may be provided to the system components as a part of process 404. For example, the E-PTO controller 320 may provide initial operating parameters to the system components. The initial operating parameters may correspond with expected performance characteristics of the system. For example, an initial operating parameter may be provided to the heat dissipation device 112 that defines a specific power input into a pump included in the heat dissipation device. The specific power input may correspond with an expected cooling fluid flow rate through the heat dissipation device 112. For example, a greater specific power input (i.e., as defined by the operating parameter) into the pump may lead to a higher the expected cooling fluid flow rate through the heat dissipation device 112. The initial operating parameters may be predetermined based on modeling, testing, and/or prior performance of the system.

After the initial operating parameters are provided to the system components, the E-PTO controller 320 checks to see if the system is in compliance at process 406. For example, the E-PTO controller 320 controller may receive data from sensor(s) 350 monitoring the various components of the system. The detection circuit 310 may then compare the data from the sensor(s) to normal operating conditions stored in the data collection circuit 308 to determine if the sensor readings are within the normal operating conditions bounds. If so, the system may be determined to be in compliance at decision 408. If not, the system may be determined to not be in compliance at decision 408. If the system is in compliance, power may continue to be supplied to the system as a part of process 420, allowing the system to continue to operate. Data may continue to be collected by the sensor(s) 350, and the process 400 may return to process 406 such that the E-PTO controller 320 may continue to monitor the system to ensure that the system is in compliance.

If the detection circuit 310 determines that the system is not in compliance at decision 408, the process 400 may proceed to process 410. At process 410, the source of the irregularity is determined. For example, the E-PTO controller 320 may be able to determine the source of irregularity based on which sensor(s) 350 are collecting data outside the normal operation bounds. For example, if a heat sensor 350 is configured to measure the temperature of the inverter 110, and the inverter 110 temperature exceeds the normal operating temperature upper bound, then the detection circuit 310 may determine the source of the irregularity to be the heat dissipation device 112 because the heat dissipation device 112 is configured to cool the inverter 110. However, the detection circuit 310 may also analyze the data from sensors 350 configured to monitor the heat dissipation device 112. For example, if a flow meter sensor 350 indicates that the fluid flow rate of the cooling fluid is within the normal operating bounds and a heat sensor 350 indicates that the cooling fluid is at a temperature within the normal operating bounds, then the detection circuit 310 may determine that the source of irregularity is the inverter 110. Once the source of irregularity is determined as a part of process 410, the irregularity is analyzed at process 412.

Process 412 includes analyzing the irregularity. For example, the detection circuit 310 may compare the irregular data received from the sensor 350 and compare this to the expected data for normal operating conditions. The detection circuit 310 may then analyze the irregularity to determine if the data is greater than the upper bound of normal operating conditions or less than the lower bound of normal operating conditions. Once this is determined, the detection circuit 310 may determine updated operating parameters at process 414. For example, if a heat sensor 350 coupled to the inverter provides the detection circuit 310 with a temperature reading that is greater than the upper bound of the normal operating conditions, analyzing this irregularity at process 412 may indicate that a higher cooling fluid flow rate from the heat dissipation device 112 may be needed. Thus, the detection circuit 310 may update the operating parameter for the heat dissipation device 112 to increase the amount of power being supplied to the pump within the heat dissipation device 112 such that the cooling fluid flow rate increases, which may be confirmed by a flow rate sensor 350 in the conduit connecting the heat dissipation device 112 to the inverter 110. After updating the operating parameters, the detection circuit 310 may continue to monitor data from the sensor(s) 350. This data may then be analyzed at decision 416 to determine if a threshold is exceeded (i.e., a critical operating condition exists). For example, an upper critical operating condition bound and a lower critical operating condition bound may exist for each sensor 350. The upper critical operating bound may be higher than the upper normal operating bound and the lower critical operating bound may be less than the lower normal operating bound.

If it is determined that the threshold is not exceed at decision 416, the process 400 returns to decision 408 to determine if the system is in compliance. If not, process 410, 412, and 414 may be repeated, thereby creating a feedback loop (e.g., a PID feedback control loop) in an attempt to bring the system within the bounds of the normal operating conditions. However, if it is determined that a threshold is exceeded at decision 416, the detection circuit 310 may send an indication of the critical operating condition to the alerting circuit 312. The alerting circuit may then cause the system or any components thereof to shut down as a part of process 418. Further, the alerting circuit 312 may cause the entire refuse vehicle 10 to shut down in response to receiving an indication of a critical operating condition.

Figure 8:
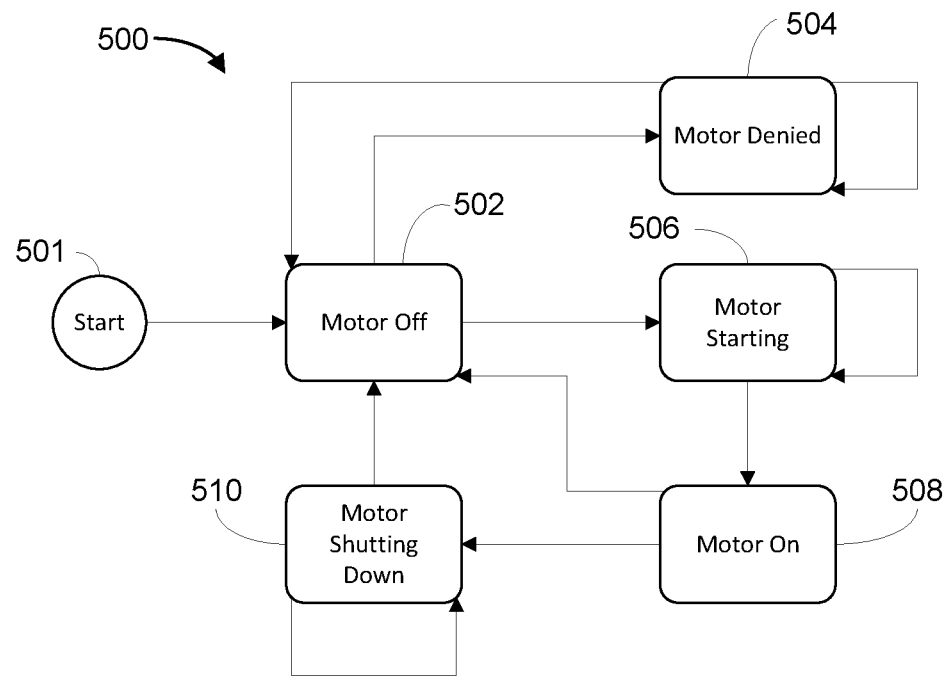
FIG. 8 is flow diagram of a motor control process according to an exemplary embodiment.

Referring now to FIG. 8, a flow diagram of a motor control process 500 is shown according to an exemplary embodiment. The motor control process 500 may be utilized to safely operate a motor (e.g., an electric motor and an inverter) during use on a refuse vehicle (e.g., during a lifting event performed by a refuse vehicle). In this sense, the motor control process 500 may be the same or similar to the E-PTO controls process 400 described above. The motor control process 500 may be used to control a motor (e.g., an electric motor included in the prime mover 20). For example, the process 500 may be implemented by a controller (e.g., the E-PTO controller 320). The E-PTO controller 320 may be communicably coupled to an inverter (e.g., the inverter 110), which is coupled to the electric motor. Thus, the E-PTO controller 320 may implement the motor control process 500 by controlling the inverter that is coupled to the electric motor. For example, the E-PTO controller 320 may implement the motor control process 500 when the prime mover 20 is being used (e.g., during a lifting event).

The motor control process 500 may begin at process 501. For example, an operator of the refuse vehicle 10 may input controls to activate the prime mover 20 as a part of operating the refuse vehicle 10. Upon receiving the input to control the prime mover 20 at process 501, the E-PTO controller 320 may ensure that the motor is off (e.g., operating at 0 RPMs) at process 502. For example, based on data received from one or more sensors 350, the E-PTO controller 320 may determine if the motor is off. For example, the refuse vehicle 10 may include a sensor 350 configured to read an output (e.g., RPMs) of the prime mover 20. If the data from the one or more sensors indicates that the motor is not off, the E-PTO controller 320 may provide a command (e.g., to the inverter 110) to shut down the motor. If the one or more sensors 350 indicate that the motor is already off, then the motor control process 500 may proceed to process 504.

At process 504, system compliance (e.g., compliance of the onboard device(s) 360) is verified before starting the motor. For example, based on data from one or more sensors 350, the E-PTO controller 320 may determine whether the system is in compliance before starting the motor. In this sense, process 504 may be the same or similar to process 406 described above. Process 504 may include checking a plurality of system parameters for compliance based on the data received from the one or more sensors 350. For example, the E-PTO controller 320 may receive data from one or more sensor 350 that is thermally coupled to the inverter 110 and/or a cooling system (e.g., a heat dissipation device 112). For example, the E-PTO controller 320 may determine whether the temperature of the inverter is lower than a safe critical temperature (e.g., 80 degrees Celsius). If the E-PTO controller 320 determines that one or more system parameters are not in compliance, the motor may be shut down and the motor control process 500 may return to process 502. However, if the system parameters are in compliance, the motor control process 500 may proceed to process 506.

At process 506, the motor is begins turning on (e.g., operating at greater than 0 RMPs). For example, the E-PTO controller 320 may provide command instructions to the prime mover 20 (e.g., by controlling the inverter 110) in response to determining that one or more systems (e.g., the onboard device(s) 360) are in compliance. In response to determining system compliance (e.g., inverter temperature is less than 80 degrees Celsius), the E-PTO Controller 320 may cause the motor to start. A sensor 350 may be coupled to the motor such that a motor output (e.g., the motor RPMs) may be monitor. The motor output data may be provided to the E-PTO controller 320 such that performance of the motor may be monitored by the E-PTO controller 320. For example, the E-PTO controller 320 may control the inverter 110 and monitor the motor output of the prime mover 20. In this sense, a feedback control loop is formed to control the prime mover 20 and the motor included in the prime mover 20.

At process 508, the motor continues to operate in the on condition. For example, the motor may be a part of the prime mover 20, which is being used during a lifting event. As a part of the lifting event, the motor may provide the power needed to perform the necessary lifting. During process 508, several events may cause the motor to turn off (i.e., the motor control process 500 returns to process 502). For example, if the vehicle 10 includes an engine, and the engine ignition is on, the E-PTO controller 320 may cause the motor to shut down in response. In this sense, the motor may not operate when the vehicle 10 is being driven. Similarly, if the E-PTO controller 320 determines that the vehicle 10 is moving (e.g., the speed exceeds a pre-determined threshold), the E-PTO controller 320 may cause the motor to shut down in response. Further, if an operator of the vehicle 10 inputs a manual stop (e.g., an emergency stop), the E-PTO controller 320 may cause the motor to shut down. Further, if the E-PTO controller 320 determines that the prime mover 20 is no longer in use (e.g., the access door to the refuse storage compartment is closed), the E-PTO controller 320 may cause the motor to shut down in response.

At process 510, the motor enters shut down mode. For example, the E-PTO controller 320 may gradually reduce the power supply to the motor (e.g., via the inverter 110) until the engine output is zero (e.g., the engine RPMs read by a sensor 350 is zero or substantially 0). For example, if the E-PTO controller 320 determines that one or more systems are no longer in compliance, the E-PTO controller 320 may cause the motor to enter shut down mode. For example, if the cooling system (e.g., the heat dissipation device 112) is determined to be over a critical temperature or if there is an inadequate volume of cooling fluid flowing through cooling system, then the E-PTO controller 320 may cause the motor to enter shut down mode. Further, the operator of the vehicle 10 may input a stop command into the E-PTO controller 320 (e.g., via a graphical user interface), which may cause the motor to enter shut down mode. Furthermore, if the motor output drops below a critical value (e.g., RPMs below 2,400) for a critical time period (e.g., 2 seconds), then the E-PTO controller 320 may cause the motor to enter shut down mode. The engine output may be monitored by the E-PTO controller 320 (e.g., by analyzing data from one or more sensor 350) to ensure the engine output is zero. Once the motor output is zero, the motor control process 500 returns to process 502.

Figure 9:
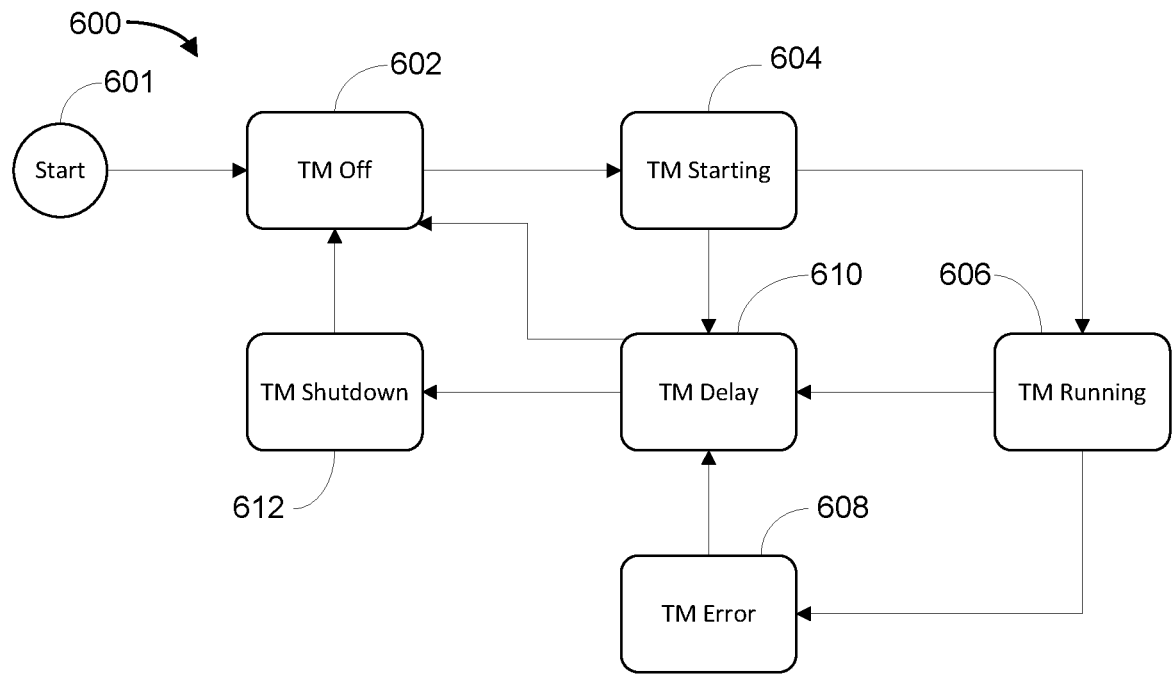
FIG. 9 is flow diagram of a thermal management process according to an example embodiment.

Referring now to FIG. 9, a flow diagram of a thermal management process 600 is shown according to an example embodiment. The thermal management process 600 may be implemented by the E-PTO controller 320 as a part of operating the vehicle 10. According to various embodiments, the E-PTO controller 320 may control a thermal management (TM) system (e.g., the heat dissipation device 112) as a part of the thermal management process 600 in order to maintain safe operating conditions of the vehicle 10 and some or all of the onboard devices 360.

The thermal management process 600 may begin at process 601. For example, at process 601, the vehicle 10 and/or any of the onboard devices 360 may be off. After process 601, the thermal management process 600 proceeds to process 602. At process 602, the thermal management system is off. For example, the E-PTO controller 320 may have caused the thermal management system to shut down, or the thermal management system may not have been active by the E-PTO controller. Alternatively, the entire vehicle 10 may be off. According to various embodiments, at process 602, the pump (e.g., a thermal pump that is a part of the heat dissipation device 112) may be in the off state. The pumps status may be determined by the E-PTO controller 320 based on data from one or more sensors 350 (e.g., a flow sensor configured to measure the fluid flow rate of cooling fluid through the pump, a pump output sensor configured to measure the pump output in RPMs, etc.)

At process 604, the thermal management system begins to start up. Process 604 may include turning on the vehicle 10 ignition and/or any of the onboard devices 360. For example, once the vehicle 10 and/or any of the onboard devices 360 are turned on, the E-PTO controller 320 may cause the thermal management system to turn on to maintain safe operating conditions of the vehicle 10. Process 604 may further involve activating the pump (e.g., a thermal pump that is a part of the heat dissipation device 112). For example, the E-PTO controller 320 may cause the pump to turn on. As a part of starting up, the E-PTO controller may gradually ramp up the power to the pump. According to various embodiments, at process 604, the pump ramps up the pump output to 40% of a maximum pump output in two seconds. According to various embodiments, one or more sensors 350 may be coupled to the pump such that the E-PTO controller 320 can determine a pump output (e.g., fluid flow rate, RPMs, etc.).

At process 606, the thermal management system continues to operate. For example, as the vehicle 10 ignition remains on and communication between the E-PTO controller 320 and the pump is maintained, the thermal management system may continue to operate. According to various embodiments, the E-PTO controller 320 may monitor the pump output (e.g., cooling fluid flow rate) to ensure the thermal management system is in compliance. For example, according to various embodiments, the E-PTO controller 320 will ensure that the fluid flow rate of the cooling fluid through the thermal management system is above a minimum threshold (e.g., 5 liters per minute). Once this minimum flow rate is confirmed by the E-PTO controller 320, the E-PTO controller 320 may cause the pump to modulate the pump output (e.g., RPMs) based on a detected fluid flow rate (e.g., as detected by one or more sensors 350) to increase the fluid flow rate of the cooling fluid to an operating flow rate (e.g., to 10 liters per minute). According to various embodiments, as the E-PTO controller 320 confirms that the thermal management system is running and in compliance, the E-PTO controller will allow the inverter 110 and motor to be turned on (e.g., as a part of motor control process 500 described above.).

At process 608, a thermal management system error is detected. For example, at process 608, communication between the E-PTO controller 320 and some or all components of the thermal management system (e.g., the heat dissipation device 112, the pump, a fan, etc.) may be lost, the fluid flow rate of the cooling fluid in the thermal management system may drop below the minimum threshold (e.g., 5 liters per minute), and/or the temperature of the cooling fluid may be above a threshold temperature (e.g., 60 degrees Celsius) may cause a thermal management system error to be detected. For example, one or more sensors 350 may provide data to the E-PTO controller 320 such that the E-PTO controller 320 may determine if a thermal management error system error exists.

In response to determining a thermal management system error exists, the E-PTO controller 320 may turn off the inverter 110 and the motor coupled to the invertor (e.g., process 520). For example, if the ignition is turned off, the thermal management control process 600 may proceed to process 610 as is discussed further below.

Alternatively, if the ignition of the vehicle remains on and the inverter 110 and the motor are still on, the E-PTO controller 320 may modulate the pump included in the thermal management system to cause a change in the fluid flow rate of the cooling fluid in the thermal management system in response to detecting a thermal management system error. Further, the E-PTO controller 320 may monitor the temperature of the cooling fluid in the thermal management system. For example, if the cooling fluid temperature is below a first threshold (e.g., 30 degrees Celsius), then the thermal management control process 600 may proceed to process 612 as discussed further below. However, if the cooling fluid temperature is above a critical threshold (e.g., 50 degrees Celsius), then the thermal management control process 600 may proceed to process 610 as is discussed further below.

According to various embodiments, the thermal management control process 600 may return to process 606 after a thermal management system error is detected if the E-PTO controller 320 subsequently determines that the thermal management system returns to compliance. For example, if the E-PTO controller 320 determines that communication between the E-PTO controller 320 and some or all components of the thermal management system (e.g., the heat dissipation device 112, the pump, a fan, etc.) has been restored, the fluid flow rate of the cooling fluid in the thermal management system is above the minimum threshold (e.g., 5 liters per minute), and/or the temperature of the cooling fluid may be below a threshold temperature (e.g., 60 degrees Celsius), the thermal management control process 600 may return to process 606 and the thermal management system may continue to operate.

At process 610, the thermal management system begins a delayed shut down. As a part of the delayed shut down, some or all components of the thermal management system may gradually be ramped down in power and eventually shut down. For example, an operator of the vehicle may enter an input (e.g., into a graphical user interface) which may cause the E-PTO controller 320 to begin a delayed shut down of the thermal management system. Further, process 610 may begin once the E-PTO controller 320 determines that the vehicle ignition has been shut down for a period of time (e.g., 1 minute). Further, process 610 may begin once the E-PTO controller 320 determines that the inverter 110 and the motor have not been running for a period of time (e.g., 5 minutes) and the coolant temperature is above a critical temperature (e.g., 50 degrees C.). Furthermore, process 610 may begin once the E-PTO controller 320 determines that the inverter 110 and the motor are not running and the coolant temperature is below a threshold (e.g., 30 degrees Celsius). In this example embodiment, the thermal management may shut down instantly, as opposed to a delayed shut down.

After process 610, the thermal management system may completely shut down at process 612. At process 612, the E-PTO controller 320 may cause the entire thermal management system to shut down. For example, the E-PTO controller 320 may shut down the pump. Further, the E-PTO controller 320 may shut down the inverter 110 and/or the motor. Furthermore, the E-PTO controller 320 may shut down the fan. According to various embodiments, the E-PTO controller 320 will only shut down the fan if the ignition is off as a part of process 610.

Although this description may discuss a specific order of method steps, the order of the steps may differ from what is outlined. Also two or more steps may be performed concurrently or with partial concurrence. Such variation will depend on the software and hardware systems chosen and on designer choice. All such variations are within the scope of the disclosure. Likewise, software implementations could be accompli shed with standard programming techniques with rule-based logic and other logic to accomplish the various connection steps, processing steps, comparison steps, and decision steps.

As utilized herein, the terms "approximately", "about", "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the invention as recited in the appended claims.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like, as used herein, mean the joining of two members directly or indirectly to one another. Such joining may be stationary (e.g., permanent, etc.) or moveable (e.g., removable, releasable, etc.). Such joining may be achieved with the two members or the two members and any additional intermediate members being integrally formed as a single unitary body with one another or with the two members or the two members and any additional intermediate members being attached to one another.

References herein to the positions of elements (e.g., "top," "bottom," "above," "below," "between," etc.) are merely used to describe the orientation of various elements in the figures. It should be noted that the orientation of various elements may differ according to other exemplary embodiments, and that such variations are intended to be encompassed by the present disclosure.

It is important to note that the construction and arrangement of the electromechanical variable transmission as shown in the exemplary embodiments is illustrative only. Although only a few embodiments of the present disclosure have been described in detail, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts or elements. It should be noted that the elements and/or assemblies of the components described herein may be constructed from any of a wide variety of materials that provide sufficient strength or durability, in any of a wide variety of colors, textures, and combinations. Accordingly, all such modifications are intended to be included within the scope of the present inventions. Other substitutions, modifications, changes, and omissions may be made in the design, operating conditions, and arrangement of the preferred and other exemplary embodiments without departing from scope of the present disclosure or from the spirit of the appended claims.

What is claimed is:

1. A refuse vehicle comprising:
a chassis supporting a plurality of wheels;
a chassis battery supported by the chassis and configured to provide electrical power to a first motor, wherein rotation of the first motor selectively drives at least one of the plurality of wheels;
a vehicle body supported by the chassis and defining a receptacle for storing refuse therein; and
an electric power take-off system coupled to the vehicle body, the electric power take-off system including:
a second motor configured to convert electrical power received from the chassis battery into hydraulic power,
an inverter configured to provide electrical power to the second motor from the chassis battery,
a heat dissipation device coupled to the inverter, wherein the heat dissipation device is configured to cool the inverter,
a first sensor configured to detect thermal energy within the inverter, and
a controller configured to receive data from the first sensor and provide operating parameters to the heat dissipation device, wherein the controller is further configured to determine if the data from the first sensor is greater than a critical operating condition and shut down the electric power take-off system in response to determining that the data from the first sensor is greater than the critical operating condition.

2. The refuse vehicle of claim 1, wherein the electric power take-off system further includes a secondary battery, such that the electric power take-off system is configured to operate solely off power from the secondary battery.

3. The refuse vehicle of claim 1, wherein the heat dissipation device is a radiator that supplies cooling fluid to the inverter via at least one conduit.

4. The refuse vehicle of claim 3, wherein the electric power take-off system further includes a second sensor within the at least one conduit configured to measure a fluid flow rate of the cooling fluid.

5. The refuse vehicle of claim 4, wherein the controller is further configured to receive data from the second sensor and determine if the data from the second sensor is less than a second critical operating condition and shut down the electric power take-off system in response to determining that the data from the second sensor is less than the second critical operating condition.

6. The refuse vehicle of claim 1, further comprising a user interface configured to display an alert in response to determining that the data from the first sensor is greater than the critical operating condition.

7. The refuse vehicle of claim 1, wherein the first sensor includes a thermocouple.

8. A refuse vehicle comprising:
a chassis supporting a plurality of wheels;
a chassis battery supported by the chassis and configured to provide electrical power to a first motor, wherein rotation of the first motor selectively drives at least one of the plurality of wheels;
a vehicle body supported by the chassis and defining a receptacle for storing refuse therein; and
an electric power take-off system coupled to the chassis, the electric power take-off system including:
a secondary battery;
a second motor configured to convert electrical power received from the chassis battery into hydraulic power,
an inverter configured to provide electrical power to the second motor from at least one of the chassis battery or the secondary battery,
a heat dissipation device in thermal communication with the inverter, wherein the heat dissipation device includes:
a fluid pump configured to pump cooling fluid through a plurality of conduits in thermal communication with the inverter;
a first sensor configured to detect a fluid flow rate of cooling fluid at least one of the plurality of conduits; and
a second sensor configured to detect a temperature of the cooling fluid in at least one of the plurality of conduits; and
a controller configured to receive data from the first sensor and second sensors and provide operating parameters to the heat dissipation device in response to receiving the data from the first sensor and the second sensor, wherein the controller is further configured to determine if the data from the first sensor is greater than a critical operating condition and shut down the electric power take-off system in response to determining that the data from the first sensor is greater than the critical operating condition.

9. The refuse vehicle of claim 8, wherein the heat dissipation device is a radiator.

10. The refuse vehicle of claim 9, wherein the electric power take-off system further includes a third sensor in thermal communication with the inverter and configured to detect thermal energy within the inverter.

11. The refuse vehicle of claim 10, wherein the controller is further configured to receive data from the third sensor and determine if the data from the third sensor is greater than a second critical operating condition and shut down the electric power take-off system in response to determining that the data from the third sensor is greater than the second critical operating condition.

12. The refuse vehicle of claim 8, wherein the electric power take-off system is self contained on the vehicle body.

13. The refuse vehicle of claim 8, further comprising a user interface configured to display an alert in response to determining that the data from the first sensor is greater than the critical operating condition.

14. The refuse vehicle of claim 8, wherein the first sensor is a positive displacement meter.

15. A method comprising:
providing power to one or more components a system of
a refuse vehicle, the refuse vehicle comprising:
a chassis supporting a plurality of wheels;
a chassis battery supported by the chassis and configured to provide electrical power to a first motor, wherein rotation of the first motor selectively drives at least one of the plurality of wheels;
a vehicle body supported by the chassis and defining a receptacle for storing refuse therein; and
an electric power take-off system coupled to the vehicle body, the electric power take-off system including:
a second motor configured to convert electrical power received from the chassis battery into hydraulic power,
an inverter configured to provide electrical power to the second motor from the chassis battery,
a heat dissipation device coupled to the inverter, wherein the heat dissipation device is configured to cool the inverter,
a first sensor configured to detect thermal energy within the inverter, and
a controller configured to receive data from the first sensor and provide operating parameters to the heat dissipation device,
providing, by the controller, initial operating parameters to the one or more components of the system;
receiving, by the controller, data from the first sensor;
determining, by the controller, if the data from the first sensor is greater than a critical operating condition; and
shutting down the one or more components of the system, by the controller, in response to determining the data received is greater than the critical operating condition.

16. The method of claim 15, wherein the electric power take-off system further includes a secondary battery, such that the electric power take-off system is configured to operate solely off power from the secondary battery.

17. The method of claim 15, wherein the heat dissipation device is a radiator that supplies cooling fluid to the inverter via at least one conduit.

18. The method of claim 17, wherein the electric power take-off system further includes a second sensor within the at least one conduit configured to measure a fluid flow rate of the cooling fluid.

19. The method of claim 18, further comprising:
receiving, by the controller, data from the second sensor;
determining, by the controller, if the data from the second sensor is less than a second critical operating condition; and
shutting down, by the controller, the electric power take-off system in response to determining that the data from the second sensor is less than the second critical operating condition.

20. The refuse vehicle of claim 1, further comprising a user interface configured to display an alert in response to determining that the data from the first sensor is greater than the critical operating condition.

* * * * *